United States Patent
Chevalier et al.

(10) Patent No.: US 9,941,170 B2
(45) Date of Patent: Apr. 10, 2018

(54) PNP-TYPE BIPOLAR TRANSISTOR MANUFACTURING METHOD

(71) Applicant: STMicroelectronics (Crolles 2) SAS, Crolles (FR)

(72) Inventors: Pascal Chevalier, Chapareillan (FR); Gregory Avenier, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/450,114

(22) Filed: Mar. 6, 2017

(65) Prior Publication Data

US 2018/0025945 A1    Jan. 25, 2018

(30) Foreign Application Priority Data

Jul. 22, 2016   (FR) ..................... 16 57067

(51) Int. Cl.
*H01L 27/102*     (2006.01)
*H01L 21/8228*    (2006.01)
(Continued)

(52) U.S. Cl.
CPC .. *H01L 21/82285* (2013.01); *H01L 21/02532* (2013.01); *H01L 21/02639* (2013.01);
(Continued)

(58) Field of Classification Search
CPC ......... H01L 21/82285; H01L 21/02532; H01L 21/02639; H01L 21/26513;
(Continued)

(56) References Cited

U.S. PATENT DOCUMENTS 6,767,797 B2    7/2004  Krutsick
8,035,167 B2 *  10/2011 Knoll ................ H01L 21/82285
                                                       257/368

(Continued)

FOREIGN PATENT DOCUMENTS

EP          0849792 A1    6/1998
WO    WO-2008068340 A1    6/2008

OTHER PUBLICATIONS

INPI Search Report and Written Opinion for FR 1657067 dated May 3, 2017 (9 pages).

*Primary Examiner* — Tu-Tu Ho
(74) *Attorney, Agent, or Firm* — Gardere Wynne Sewell LLP

(57) ABSTRACT

A PNP transistor is manufactured in parallel with the manufacture of NPN, NMOS, and PMOS transistors. A first semiconductor layer is deposited on a P-type doped semiconductor substrate and divided into first, second, and third regions, with the third region forming the base. An insulating well is deeply implanted into the substrate. First and second third wells, respectively of N-type and P-type are formed to extend between the second region and third region and the insulating well. A third well of P-type is formed below the third region to provide the collector. Insulating layers are deposited over the third region and patterned to form an opening. Epitaxial growth of a second P-type doped semiconductor layer is performed in the opening to provide the emitter.

17 Claims, 11 Drawing Sheets

(51) Int. Cl.
  *H01L 21/761* (2006.01)
  *H01L 21/265* (2006.01)
  *H01L 21/02* (2006.01)
  *H01L 21/285* (2006.01)
  *H01L 21/311* (2006.01)
  *H01L 29/06* (2006.01)

(52) U.S. Cl.
  CPC .. *H01L 21/26513* (2013.01); *H01L 21/28518* (2013.01); *H01L 21/31111* (2013.01); *H01L 21/761* (2013.01); *H01L 27/1022* (2013.01); *H01L 29/0646* (2013.01)

(58) Field of Classification Search
  CPC ......... H01L 21/28518; H01L 21/31111; H01L 21/761; H01L 27/1022; H01L 29/0646
  USPC ....................................................... 257/574
  See application file for complete search history.

(56) References Cited

U.S. PATENT DOCUMENTS

| | | | |
|---|---|---|---|
| 9,184,265 B2 * | 11/2015 | Lai | H01L 29/66166 |
| 2005/0029624 A1 | 2/2005 | Bottner et al. | |
| 2005/0077571 A1 | 4/2005 | Kanda et al. | |

* cited by examiner

PNP-TYPE BIPOLAR TRANSISTOR MANUFACTURING METHOD

PRIORITY CLAIM

This application claims the priority benefit of French Application for Patent No. 1657067, filed on Jul. 22, 2016, the content of which is hereby incorporated by reference in its entirety to the maximum extent allowable by law.

TECHNICAL FIELD

The present disclosure relates to a method of manufacturing PNP-type bipolar transistors, and more particularly a method of manufacturing PNP-type bipolar transistors compatible with the simultaneous manufacturing of NPN-type bipolar transistors, of N-channel MOS transistors, and of P-channel MOS transistors, in a so-called BiCMOS technology.

BACKGROUND

Various methods of manufacturing bipolar transistors of various types and MOS transistors of various types are known. Such methods are generally provided to decrease the number of manufacturing steps and to optimize each of the transistors.

A method minimizing the number of manufacturing steps and optimizing the performance of PNP-type and NPN-type bipolar transistors is needed. The desired performances of the PNP bipolar transistor are, for example, a gain higher than 100 and a transition frequency greater than 25 GHz. The desired performances of the NPN type bipolar transistor are, for example, a cut-off frequency greater than 300 GHz.

SUMMARY

Thus, an embodiment provides a method of manufacturing a PNP-type bipolar transistor in parallel with the manufacturing of an NPN-type bipolar transistor and of N-channel and P-channel MOS transistors, the method comprising, in the manufacturing of the PNP-type bipolar transistor, the successive steps of: a) deposition, on a P-type doped semiconductor substrate, of a first N-type doped semiconductor layer divided by insulating layers into first, second, and third regions; b) deep implantation into the substrate of an N-type doped insulating well; c) implantation of a first N-type doped well between said first region and the insulating well; d) implantation of a second P-type doped well into the substrate, between said second region and the insulating well; e) implantation of a third P-type doped well into the substrate, between said third region and the insulating well, the third well forming the collector of the transistor; f) deposition of a first insulating layer and of a second insulating layer selectively etchable over the first insulating layer on the third region and creation of an opening in a portion of the third region; g) selective epitaxy of a second P-type doped semiconductor layer in said opening, the second layer forming the emitter of the transistor, and removal of the first and second insulating layers; h) implantation of N-type dopant atoms into the first region; and i) implantation of P-type dopant atoms into the second region, steps a), b), c), d), i), j) being common to N-channel and P-channel MOS transistor manufacturing steps.

According to an embodiment, at step e), the implantation of the third well is performed by deep implantation of a fourth P-type doped well and by implantation of a fifth P-type doped well.

According to an embodiment, the second layer is further doped with carbon atoms.

According to an embodiment, the method further comprises a step j), subsequent to step i), of forming silicided areas on the upper surfaces of the first, second, and third regions and of the second layer.

According to an embodiment, the method further comprises a step k) subsequent to step i) of forming spacers on the lateral edges of the second layer.

According to an embodiment, at step g), the first and second insulating layers are removed by wet etching.

According to an embodiment, at step a), the first semiconductor layer is deposited by epitaxy.

According to an embodiment, the first insulating layer is a silicon oxide layer and the second insulating layer is a nitride layer.

According to an embodiment, the insulating material is silicon oxide.

According to an embodiment, the substrate is made of silicon.

Another embodiment provides a PNP-type bipolar transistor comprising an emitter having a rectangular transverse cross-section, raised with respect to a base of the transistor and having lateral surfaces protected by spacers, the transistor further comprising a base contact formed on a heavily-doped N-type portion of the base delimited by the spacers.

BRIEF DESCRIPTION OF THE DRAWINGS

The foregoing and other features and advantages will be discussed in detail in the following non-limiting description of specific embodiments in connection with the accompanying drawings; wherein.

DETAILED DESCRIPTION

Figure 1:
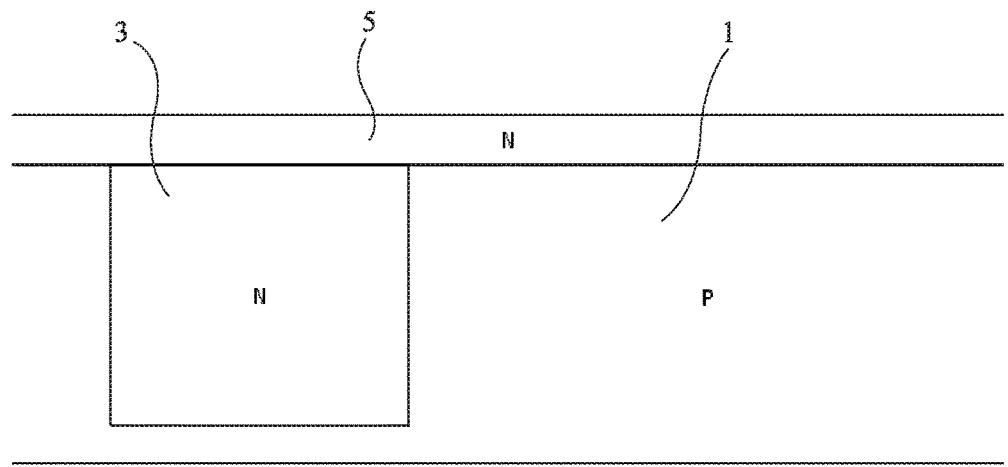
FIGS. 1 to 21 are cross-section views illustrating the successive steps of an embodiment of a method of manufacturing a PNP-type bipolar transistor and an NPN-type bipolar transistor.

For clarity, the same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying the absolute position, such as terms "left-hand", "right-hand", etc., or the relative position, such as terms "top", "lower", and "upper", etc., reference is made to the orientation of the drawings. Unless otherwise specified, expressions "in the order of" and "substantially" mean to within 10%, preferably to within 5%.

FIGS. 1 to 21 are cross-section views illustrating successive steps of a method of manufacturing a PNP-type bipolar transistor and an NPN-type bipolar transistor. The method further enables to simultaneously form N-channel MOS transistors and P-channel MOS transistors, but the MOS transistor forming steps are not detailed herein.

Steps of manufacturing a PNP-type bipolar transistor have been shown in the right-hand portion of each of FIGS. 1 to 21 and steps of manufacturing an NPN-type bipolar transistor have been shown in the left-hand portion of each of FIGS. 1 to 21.

FIG. 1 illustrates a step of the method of manufacturing PNP-type and NPN-type bipolar transistors. The initial structure is a P-type doped semiconductor layer 1, currently made of silicon. Layer 1, also referred to as a substrate hereafter, is formed on a semiconductor support. The semiconductor support is, for example, lightly N-type doped. For example, layer 1 is formed by epitaxy. An N-type doped semiconductor well 3 is formed in substrate 1 at the location where the NPN-type transistor is desired to be formed. Well 3 is formed from the upper surface of substrate 1. An N-type doped semiconductor layer 5 is deposited by epitaxy on the upper surface of substrate 1 and on the upper surface of well 3. As an example, layer 5 has a thickness in the range from 200 to 600 nm, for example, in the order of 400 nm.

Figure 2:
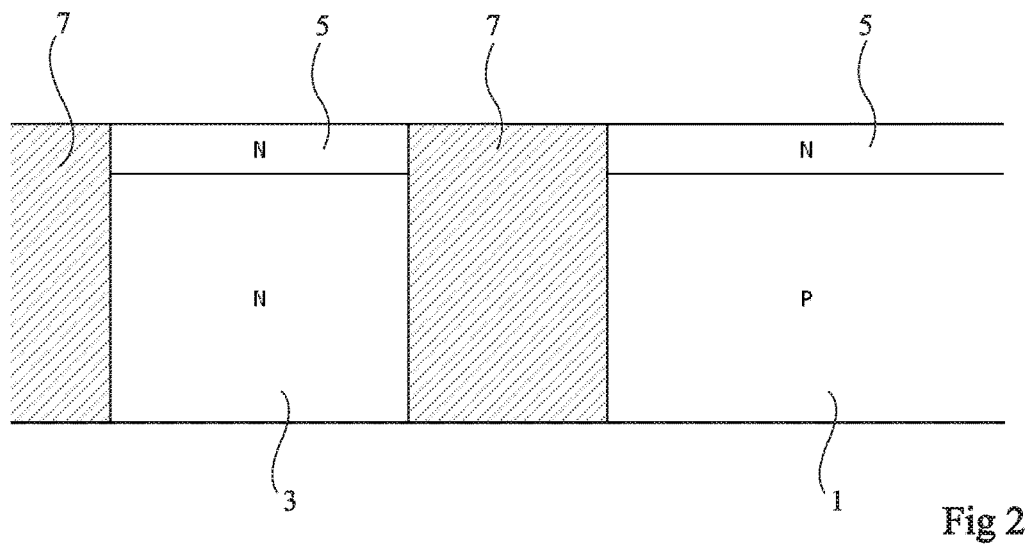

At the step of FIG. 2, deep insulating trenches 7 (Deep Trench Insulation—DTI) are formed across the entire thickness of layer 1, for example in the range from 2 to 6 µm, typically in the order of 4 µm. Trenches 7 surround the PNP transistor manufacturing area and the NPN transistor manufacturing area, although the trench is not shown on the right-hand side of FIGS. 1 to 21.

Figure 3:
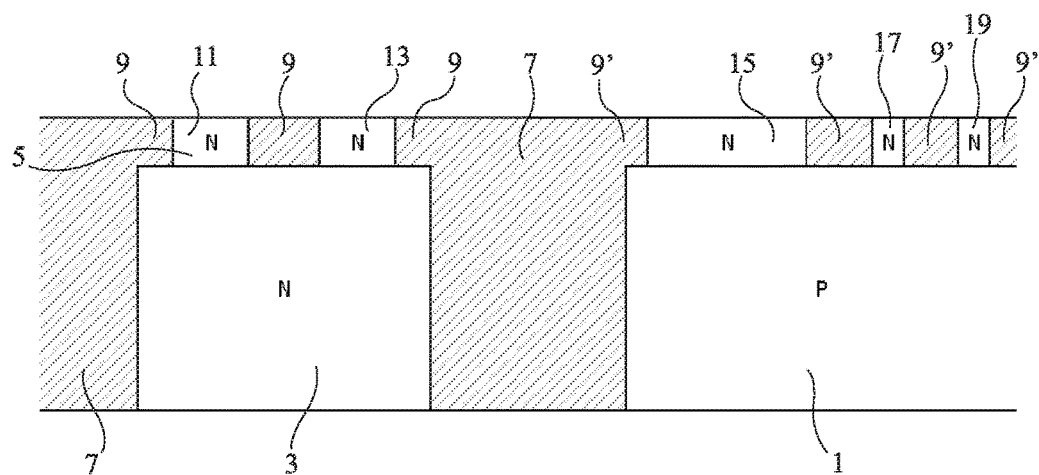

At the step of FIG. 3, the portion of layer 5 resting on well 3 is divided by shallow insulating trenches 9 and 9' (Shallow Trench Insulation—STI) at least in a region 11 and a region 13. Regions 11 and 13 have a substantially identical width. The portion of layer 5 resting on substrate 1 is divided by trenches 9' into three regions 15, 17, and 19. Region 15 is wider than regions 17 and 19, which have substantially the same width.

Figure 4:
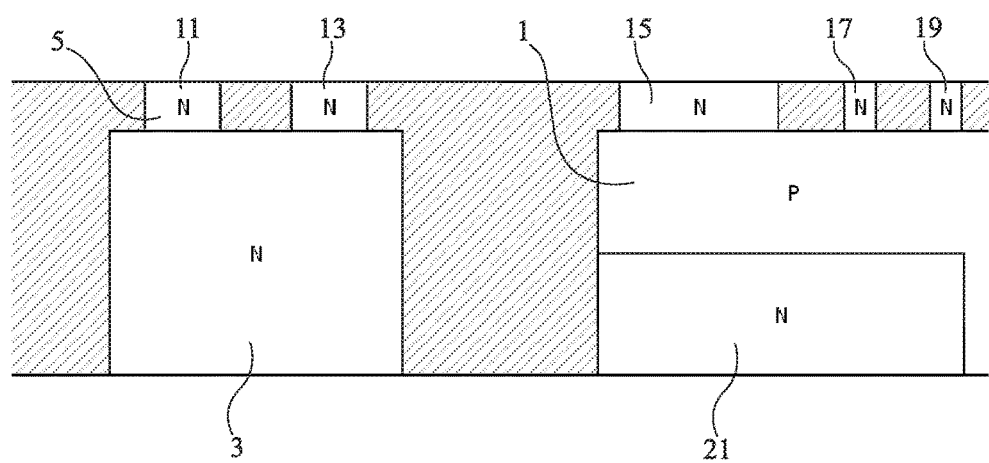

At the step of FIG. 4, an N-type doped well 21 is formed by deep implantation into substrate 1 of the PNP-type transistor manufacturing area. Well 21 is formed on the lower surface side of substrate 1 and extends under the entire width of the PNP-type bipolar transistor manufacturing area.

Figure 5:
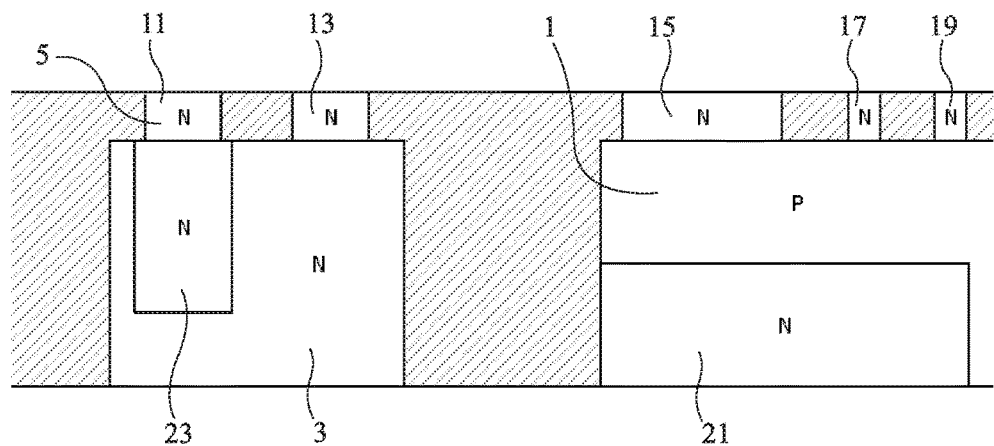

At the step of FIG. 5, a heavily-doped N-type well 23 is formed by implantation into well 3 of the NPN-type bipolar transistor manufacturing area. Well 23 is formed under and in contact with the upper surface of well 3 and extends towards the lower portion of well 3. Well 23 is positioned under and in contact with region 11 of layer 5.

Figure 6:
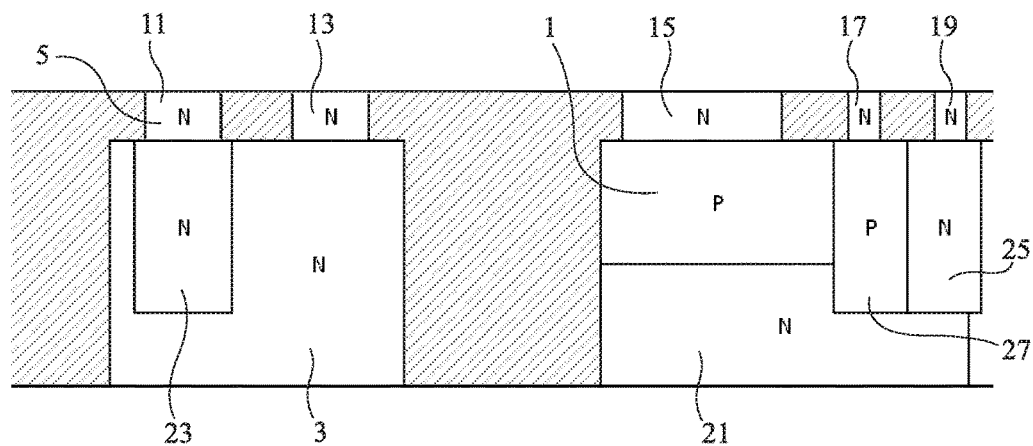

At the step of FIG. 6, an N-type doped well 25 and a P-type doped semiconductor well 27 are formed by implantation into substrate 1 of the PNP-type bipolar transistor manufacturing area. Wells 25 and 27 are adjacent, and extend from the upper surface of substrate 1 to and extend into well 21. N-type doped well 25 extends under (and in contact with) region 19 of layer 5. P-type doped well 27 extends under (and in contact with) region 17 of layer 5. Of course, to save manufacturing steps, N-type well 25 may be formed at the same time as N-type well 23.

Figure 7:
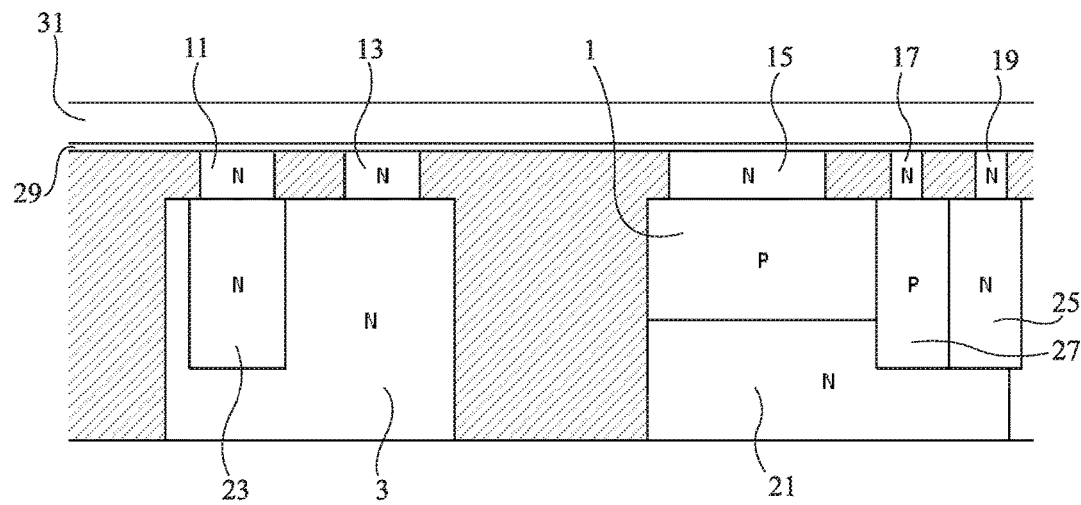

At the step of FIG. 7, an insulating layer 29 and a polysilicon layer 31 are successively deposited on the upper surface of the structure. Layers 29 and 31 are further used to form the insulated gate of the MOS transistors manufactured in parallel (but not shown) with the bipolar transistors. As an example, insulating layer 29 is made of silicon oxide or oxynitride.

Figure 8:
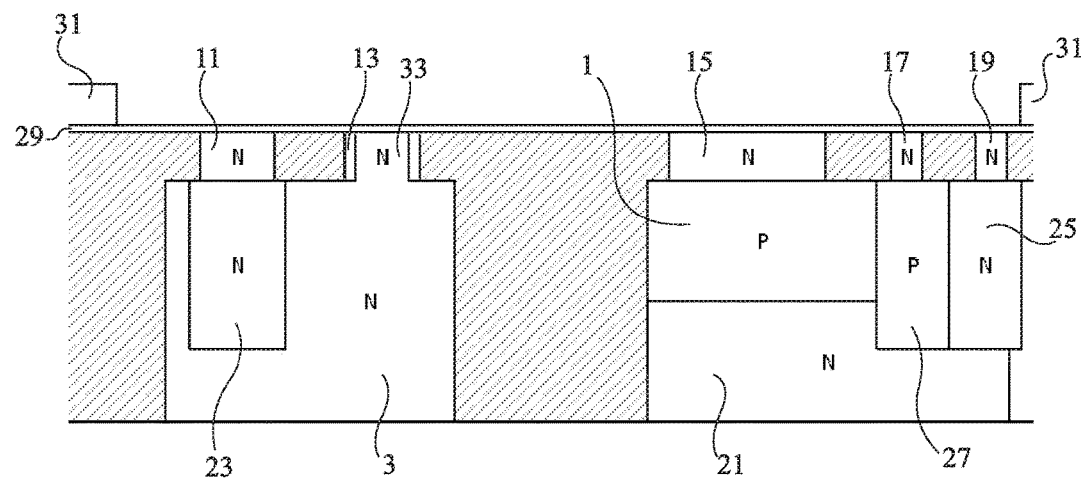

At the step of FIG. 8, polysilicon layer 31 is removed by masking of the structure above the NPN-type and PNP-type bipolar transistor manufacturing areas. The manufacturing steps shown in FIGS. 8 to 19 are specific to the manufacturing of bipolar transistors. On the left-hand side of the drawing, a specifically N-type doped semiconductor well 33 is formed in the central portion of region 13 of layer 5. Well 33 is intended to form the subcollector region of the NPN-type bipolar transistor (Selectively Implanted Collector— SIC). Well 33 extends all across the thickness of region 13 of layer 5.

Figure 9:
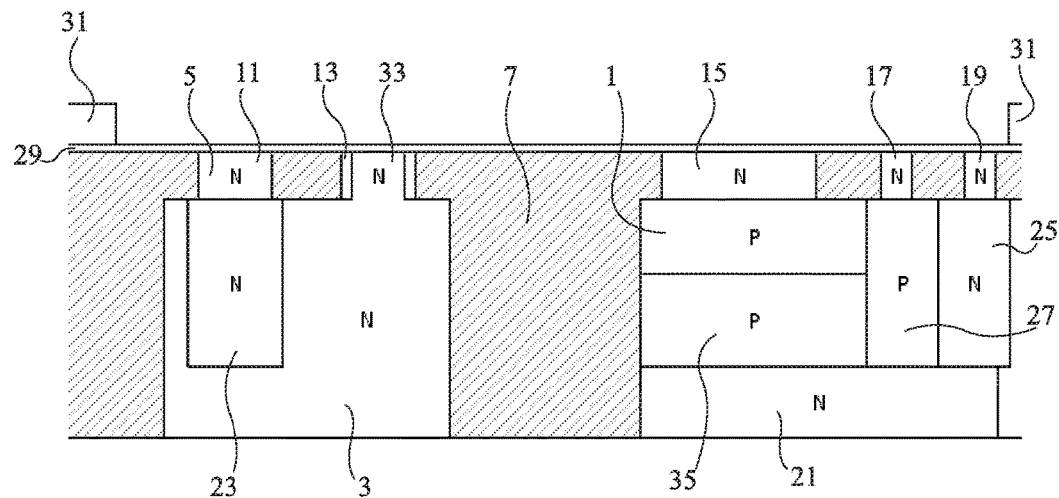

At the step of FIG. 9, on the right-hand side of the drawing, a P-type doped semiconductor well 35 is formed by deep implantation into substrate 1. Well 35 is formed on and in contact with the upper surface of well 21 and extends laterally between trench 7 and well 27. Well 35 is positioned under region 15 of layer 5 but is not in contact therewith (separated therefrom by substrate 1). Well 35 forms the extrinsic collector of the PNP-type bipolar transistor.

Figure 10:
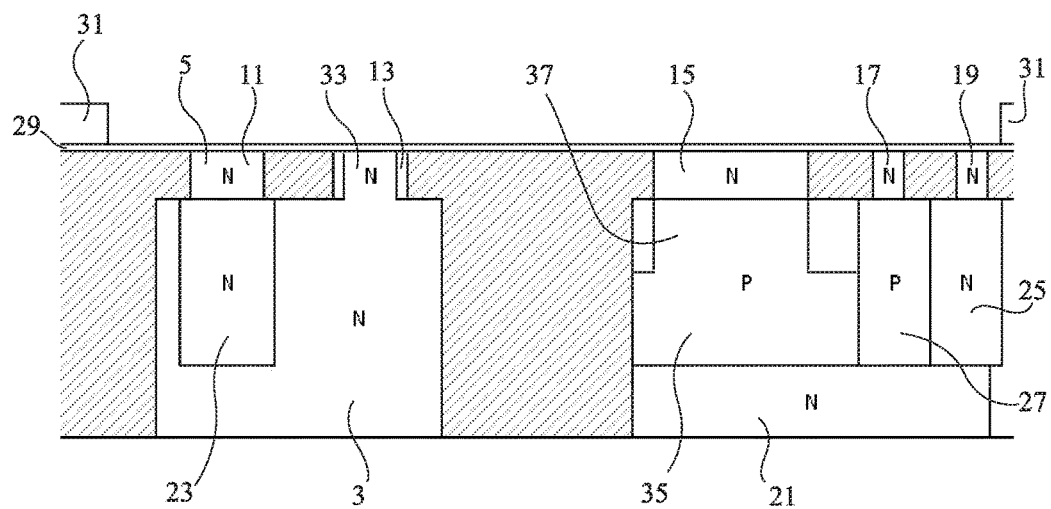

At the step of FIG. 10, a P-type doped well 37 is formed by implantation into substrate 1 of the PNP-type bipolar transistor manufacturing area. Well 37 is formed between the upper surface of well 35 and the lower surface of region 15 of layer 5. Well 37 is not in lateral contact with well 27 (separated therefrom by a portion of substrate 1). Well 37 forms the intrinsic collector of the PNP-type bipolar transistor. The complete collector has a thickness in the range from 800 to 1,200 nm, for example, in the order of 950 nm.

Figure 11:
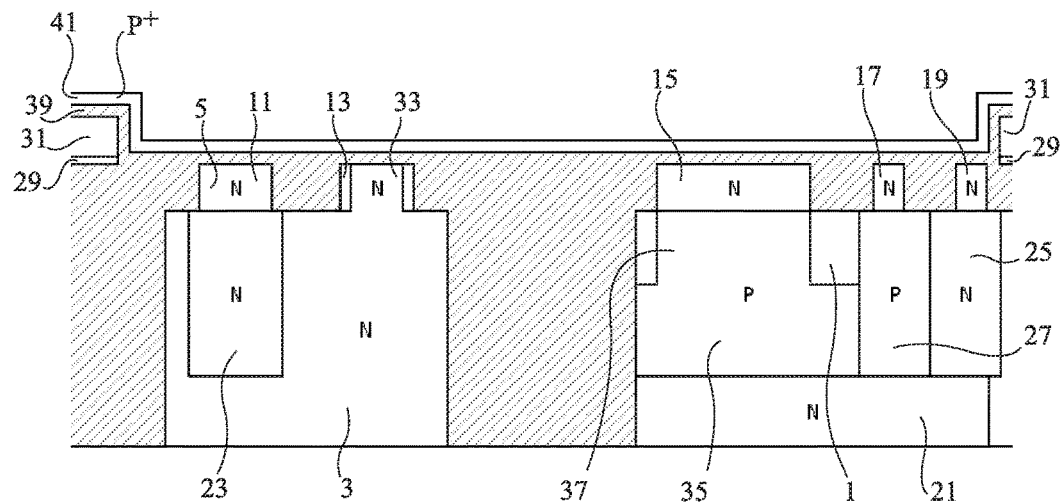

At the step of FIG. 11, insulating layer 29 is removed by masking the upper surface of the NPN and PNP-type bipolar transistor manufacturing areas. An insulating layer 39 and a heavily-doped P-type polysilicon layer 41 are deposited on the upper surface of the structure. Layer 41 is deposited to form the extrinsic base of the NPN-type bipolar transistor. As an example, layer 39 is made of silicon oxide or oxynitride.

Figure 12:
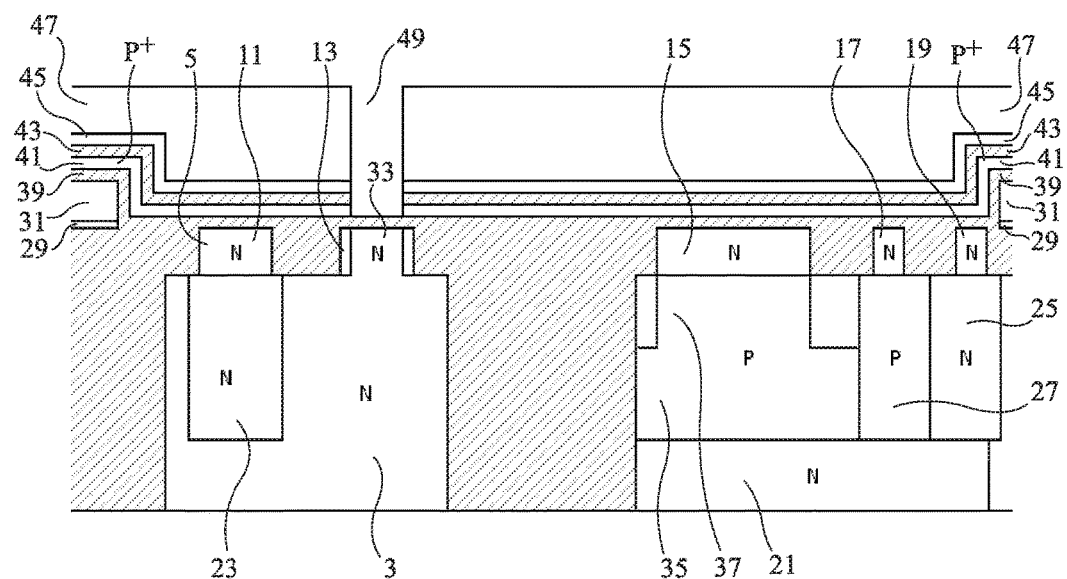

At the step of FIG. 12, two insulating layers 43 and 45 and one resist layer 47 are successively deposited on the upper surface of layer 41. As an example, the insulating layers are made of silicon oxide and of silicon nitride. An etch mask is formed in resin layer 47. An opening 49, having a width smaller than that of well 33, is formed in layers 41, 43, and 45 above well 33.

Figure 13:
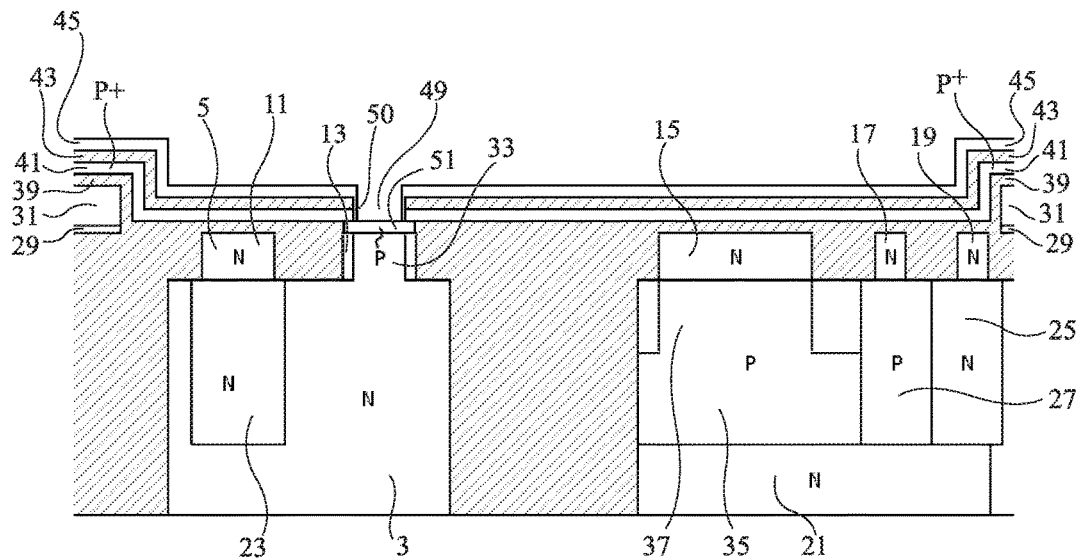

At the step of FIG. 13, after the removal of resist layer 47, spacers 50 are formed by deposition and etching of a silicon nitride layer to protect the walls of opening 49. A portion of silicon oxide layer 39 is removed by wet etching at the bottom of opening 49. A semiconductor layer 51, for example, made of silicon-germanium, is formed by epitaxial growth selective over the dielectric materials above well 33. Layer 51 is formed on well 33 and region 13 of layer 5 and extends across a width greater than that of opening 49. Thus, layer 51 is in contact by its upper surface with well 33 forming the collector of the NPN transistor and is in contact by the periphery of its upper surface with heavily-doped P-type layer 41 forming the extrinsic base of the NPN transistor. Layer 51 forms the intrinsic base of the NPN transistor.

Figure 14:
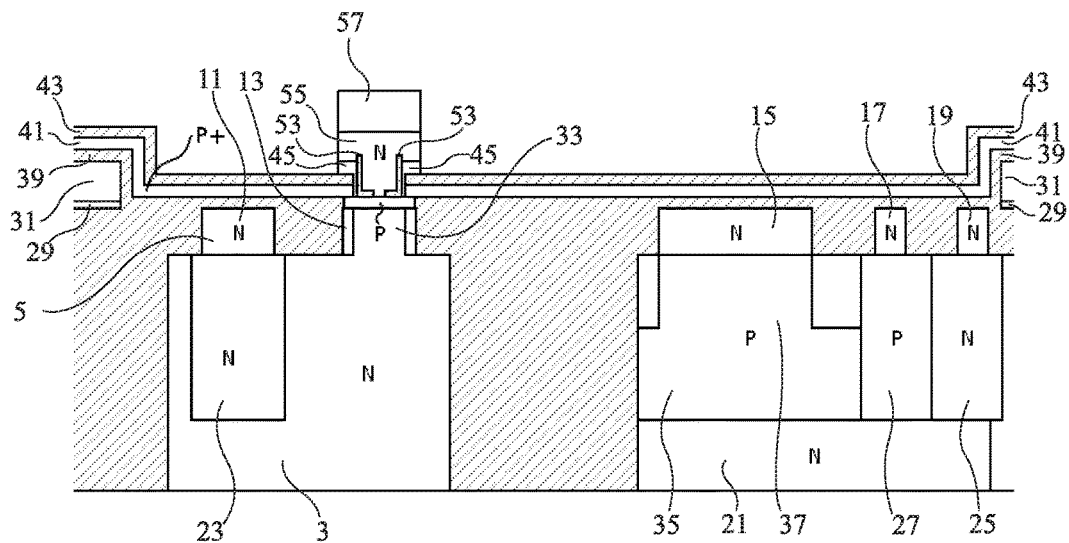

At the step of FIG. 14, the emitter of the NPN-type bipolar transistor is formed on the left-hand side of the drawing. To achieve this, two insulating spacers 53 positioned at the bottom and against the walls of opening 49 are previously formed. Spacers 53 delimit on layer 51 an opening having an elementary dimension in the range from 50 to 100 nm. As an example, spacers 53 are made of silicon oxide. A heavily-doped N-type semiconductor layer 55 and a resist layer 57 are successively deposited on the upper surface of the structure. Layers 45, 55, and 57 are then removed by etching to only leave a portion of said layers on the upper surface of the structure. The remaining portions of layers 45, 55, and 57 have a width similar to the width of region 13 of layer 5. Layer 55 forms the emitter contact of the NPN-type bipolar transistor. Layer 55 is in contact with layer 51, which forms the intrinsic base of the same transistor.

Figure 15:
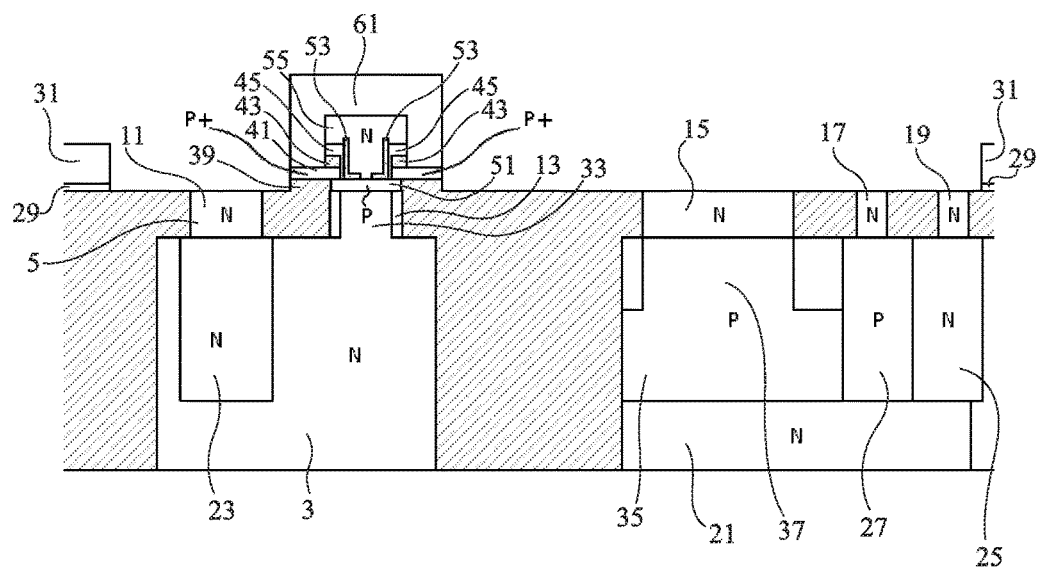

At the step of FIG. 15, resist layer 57 is removed and another resist layer 61 is deposited on the upper surface of the structure. A new etch mask is formed in resist layer 61. The etch mask enables to only leave a portion of layers 39 and 41 on the upper surface of the structure. The remaining portions of layers 39 and 41 are positioned on area 13 of layer 5 but have a larger width than the width of area 13. Resist layer 61 is then removed.

Figure 16:
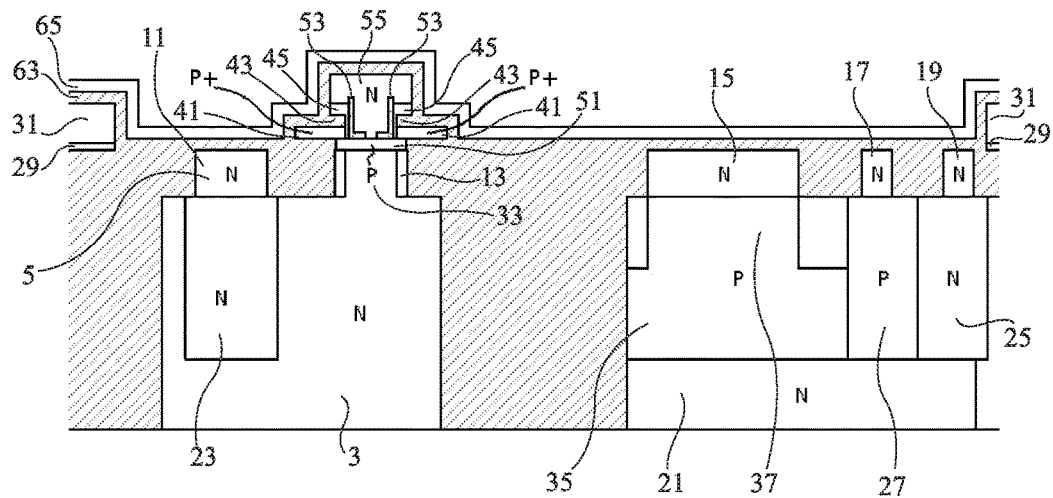

At the step of FIG. 16, an insulating layer 63 and an insulating layer 65, selectively etchable over insulating layer 63, are deposited on the upper surface of the structure. As an example, insulating layer 63 is a silicon oxide layer and insulating layer 65 is a silicon nitride layer.

Figure 17:
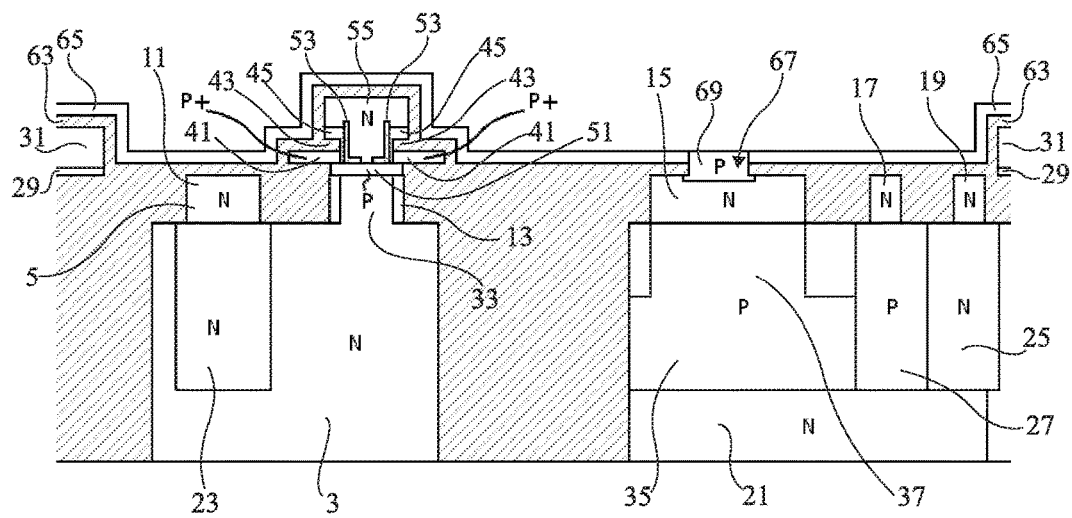

At the step of FIG. 17, on the right-hand side of the drawing, an opening 67 is formed by masking in layers 63 and 65. Opening 67 is formed above a portion of region 15 of layer 5 and extends across the entire thickness of insulating layers 63 and 65. A heavily-doped P-type semiconductor layer 69 is formed by selective epitaxy in opening 67. Layer 69 is the emitter of the PNP-type bipolar transistor. Layer 69 may be doped with carbon atoms to decrease the diffusion of dopant atoms in the rest of the structure. The deposition of layer 69 enables to optimize the doping profile of the emitter of the PNP-type bipolar transistor. Further, layer 69 is deposited in opening 67, which enables to control the morphology of the emitter. Indeed, the final emitter and base contacts of the PNP-type bipolar transistors will be close and at the step of FIG. 20, spacers may be formed on the sides of layer 69, which will insulate the emitter and base contacts of the PNP-type bipolar transistor. Further, the deposition of layer 69 has a low thermal budget and does not thermally influence the doping of layer 51 forming the base of the NPN-type bipolar transistor.

Figure 18:
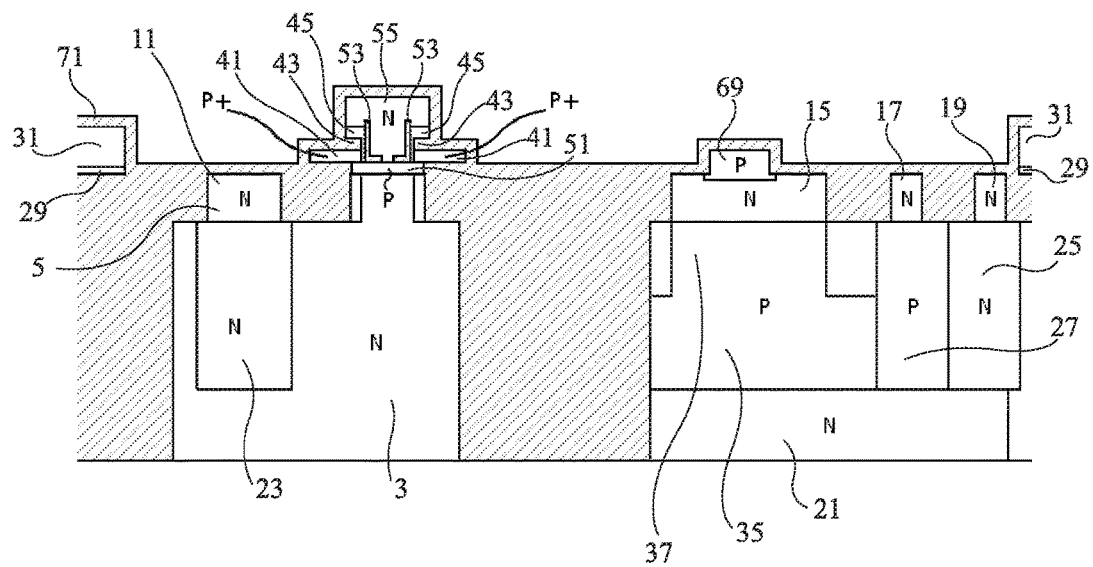

At the step of FIG. 18, insulating layers 63 and 65 are removed, for example, by wet etching. A new insulating layer 71 is deposited on the upper surface of the structure. Layer 71 protects the NPN and PNP-type bipolar transistors during steps of doping of the MOS transistor gates. Once these steps are over, layer 71 is removed.

Figure 19:
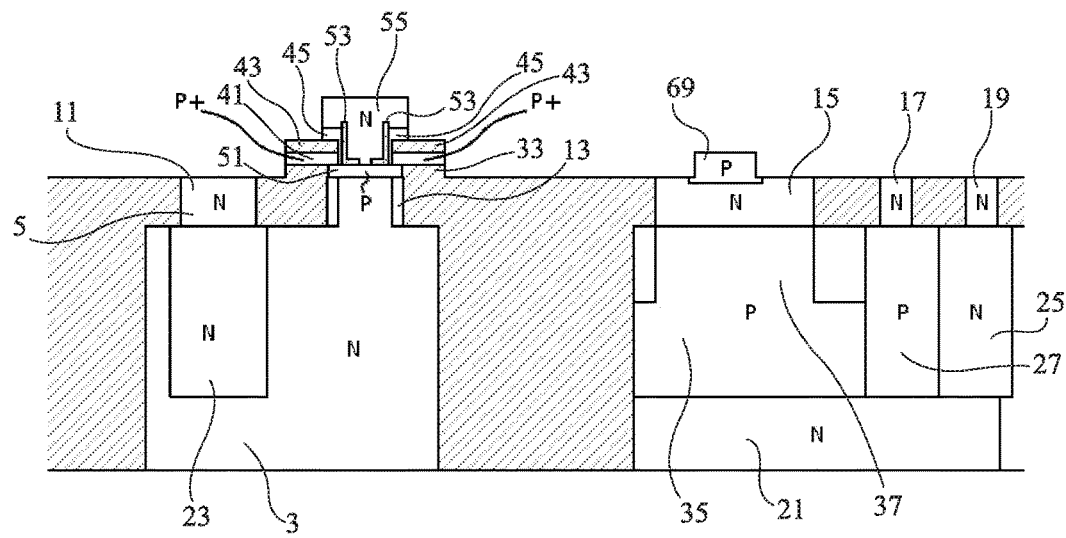
Figure 20:
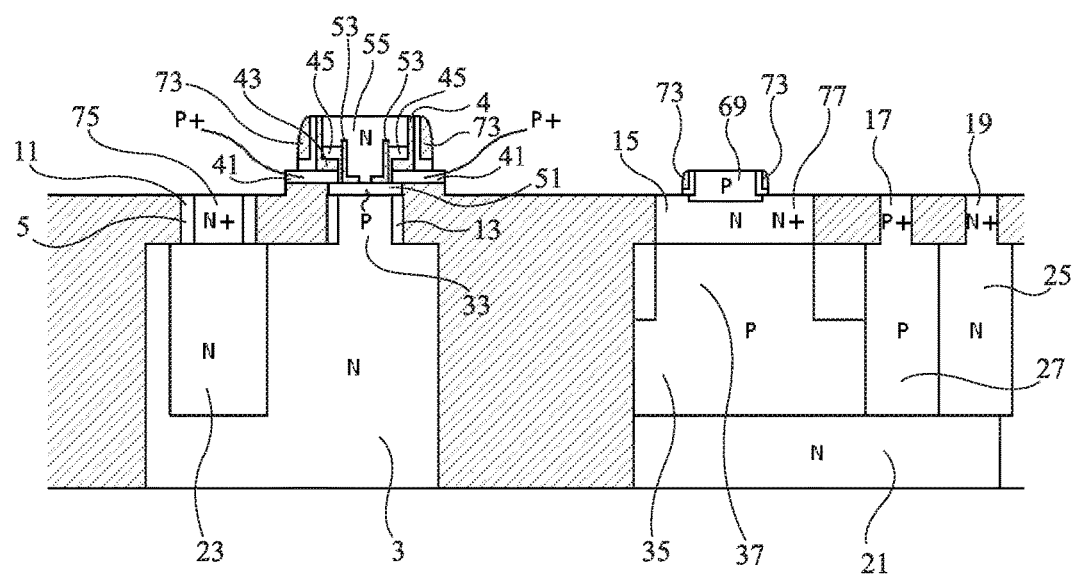
Figure 21:
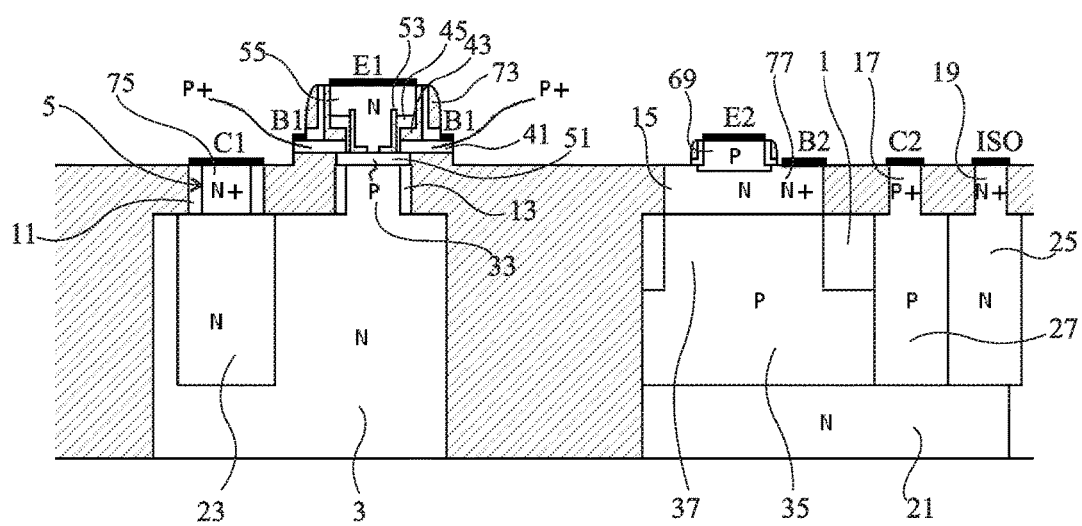

At the step of FIG. 19, layers 29 and 31 are removed from the entire structure and the steps illustrated in FIGS. 19, 20, and 21 are common to bipolar transistor manufacturing and to MOS transistor manufacturing.

At the step of FIG. 20, double spacers 73 are formed on the outer lateral surfaces of the emitters of the bipolar transistors. The width of layer 41 is capable of receiving, in addition to double spacers 73, a silicided area receiving the base contact of the NPN-type bipolar transistor. The spacers are for example formed of a nitride layer and of a silicon oxide layer. N-type dopant atoms are simultaneously implanted into a central portion 75 of region 11 of layer 5, into a portion 77 of region 15 of layer 5, and into region 19 of layer 5. Portion 77 is positioned at one end of region 15. Central portion 75 of region 11 improves the collector contact of the NPN-type bipolar transistor. Portion 77 of region 15 improves the base contact of the PNP-type bipolar transistor. Region 19 improves the insulating contact of the PNP-type bipolar transistor. P-type dopant atoms are implanted in region 17 of layer 5. Region 17 improves the collector contact of the PNP-type bipolar transistor.

At the step of FIG. 21, silicided areas E1, B1, C1, E2, B2, C2, and ISO are formed on the contact areas of the bipolar transistors. Silicided area E1 is formed on the upper surface of layer 55 and forms the emitter contact of the NPN-type bipolar transistor. Silicided area B1 is formed on the visible upper surface of layer 41 and forms the base contact of the NPN-type bipolar transistor. Silicided area C1 is formed on the upper surface of layer 75 and forms the collector contact of the NPN-type bipolar transistor. Silicided area E2 is formed on the upper surface of layer 69 and forms the emitter contact of the PNP-type bipolar transistor. Silicided area B2 is formed on the upper surface of portion 77 of layer 5 and forms the base contact of the PNP-type bipolar transistor. Silicided area C2 is formed on the upper surface of region 17 of layer 5 and forms the collector contact of the PNP-type bipolar transistor. Silicided area ISO is formed on the upper surface of region 19 of layer 5 and forms a contact with well 21 of the PNP-type bipolar transistor. Electric contacts are then deposited on the silicided areas.

As an example, the previously-described method may be formed with the doping levels given in the following tables.

For the PNP-type bipolar transistor:

| Components | Conductivity type | Doping level (atoms · cm$^{-3}$) |
|---|---|---|
| Well 21 | N | From $5 \times 10^{16}$ to $5 \times 10^{17}$, for example $10^{17}$ |
| Extrinsic collector (well 35) | P | From $10^{17}$ to $10^{18}$, for example $5 \times 10^{17}$ |
| Intrinsic collector (well 37) | P | From $5 \times 10^{17}$ to $5 \times 10^{18}$, for example $2 \times 10^{18}$ |
| Well 25 | N | From $7 \times 10^{19}$ to $3 \times 10^{20}$, for example $10^{20}$ |
| Well 27 | P | From $5 \times 10^{17}$ to $5 \times 10^{18}$, for example $10^{18}$ |
| Region 15 of layer 5 | N | $<10^{16}$ |
| Region 17 of layer 5 | P | From $8 \times 10^{20}$ to $5 \times 10^{21}$, for example $2 \times 10^{21}$ |
| Region 19 of layer 5 | N | From $8 \times 10^{20}$ to $5 \times 10^{21}$, for example $2 \times 10^{21}$ |
| Base (portion 77 of region 15) | N | From $10^{17}$ to $10^{18}$, for example $5 \times 10^{17}$ |
| Emitter (layer 69) | P | From $5 \times 10^{19}$ to $5 \times 10^{20}$, for example $10^{20}$ |

For the NPN-type bipolar transistor:

| Components | Conductivity type | Doping level (atoms · cm$^{-3}$) |
|---|---|---|
| Collector (Well 3) | N | From $10^{19}$ to $10^{20}$, for example $5 \times 10^{19}$ |
| Well 23 | N | From $7 \times 10^{19}$ to $3 \times 10^{20}$, for example $10^{20}$ |
| Well 33 | N | From $10^{18}$ to $10^{20}$, for example $2 \times 10^{19}$ |
| Central portion 75 of region 11 | N | From $8 \times 10^{20}$ to $5 \times 10^{21}$, for example $2 \times 10^{21}$ |
| Intrinsic base (Layer 51) | P | From $10^{19}$ to $10^{20}$, for example $5 \times 1019$ |
| Extrinsic base (Layer 41) | P | From $5 \times 10^{20}$ to $5 \times 10^{21}$, for example $10^{21}$ |
| Emitter (layer 55) | N | From $7 \times 10^{19}$ to $10^{21}$, for example $3 \times 10^{21}$ |

As an example, the PNP transistor manufactured by the manufacturing method described herein has, in the case of the above-described doping levels, a gain in the range from 100 to 220 and a transition frequency in the range from 30 to 45 GHz.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:
1. A method of manufacturing a PNP-type bipolar transistor in parallel with the manufacturing of N-channel and P-channel MOS transistors, the method comprising the successive steps of:

a) depositing, on a P-type doped semiconductor substrate, a first N-type doped semiconductor layer divided by insulating layers into first, second, and third regions;
b) deep implanting an N-type doped insulating well into the P-type doped semiconductor substrate;
c) implanting a first N-type doped well between said first region and the N-type doped insulating well;
d) implanting a second P-type doped well into the P-type doped semiconductor substrate between said second region and the N-type doped insulating well;
e) implanting a third P-type doped well into the P-type doped semiconductor substrate, between said third region and the N-type doped insulating well, the third P-type doped well forming the collector of the transistor;
f) depositing a first insulating layer and a second insulating layer selectively etchable over the first insulating layer on the third region and creating an opening on a portion of the third region;
g) selective epitaxially growing a second P-type doped semiconductor layer in said opening, the second P-type doped semiconductor layer forming the emitter of the transistor, and removing the first and second insulating layers;
h) implanting N-type dopant atoms into the first region; and
i) implanting P-type dopant atoms into the second region, wherein steps a), b), c), d), i), j) are performed in common with manufacturing the N-channel and P-channel MOS transistors.

2. The method of claim 1, wherein, at step e), implanting the third P-type doped well is performed by deep implanting a fourth P-type doped well and implanting a fifth P-type doped well.

3. The method of claim 1, further comprising doping the second P-type doped semiconductor layer with carbon atoms.

4. The method of claim 1, further comprising a step j), subsequent to step i), forming silicided areas on the upper surfaces of the first, second, and third regions and of the second P-type doped semiconductor layer.

5. The method of claim 1, further comprising a step k) subsequent to step i) of forming spacers on lateral edges of the second P-type doped semiconductor layer.

6. The method of claim 1, further comprising, at step g), removing the first and second insulating layers by wet etching.

7. The method of claim 1, further comprising, at step a), depositing the first N-type doped semiconductor layer by epitaxy.

8. The method of claim 1, wherein the first insulating layer is a silicon oxide layer and the second insulating layer is a nitride layer.

9. The method of claim 1, wherein the insulating material is silicon oxide.

10. The method of claim 1, wherein the P-type doped semiconductor substrate is made of silicon.

11. A method of manufacturing a PNP-type bipolar transistor, comprising the successive steps of:

a) depositing a first N-type doped semiconductor layer on a P-type doped semiconductor substrate;
b) dividing the first N-type doped semiconductor layer into first, second, and third N-type doped regions separated by insulating regions;
c) implanting an N-type doped insulating well into the P-type doped semiconductor substrate below the first, second, and third N-type doped regions;
d) implanting a first N-type doped well into the P-type doped semiconductor substrate to extend between and be in contact with said first N-type doped region and the N-type doped insulating well;
e) implanting a second P-type doped well into the P-type doped semiconductor substrate to extend between and be in contact with said second N-type doped region and the N-type doped insulating well;
f) implanting a third P-type doped well into the P-type doped semiconductor substrate in contact with said third N-type doped region and separated from the N-type doped insulating well and further separated from the second P-type doped well by a portion of the P-type doped semiconductor substrate, the third P-type doped well forming a collector of the PNP-type bipolar transistor;
g) epitaxially growing a second P-type doped semiconductor layer on and in contact with the third N-type doped region, the second P-type doped semiconductor layer forming an emitter of the PNP-type bipolar transistor;
h) implanting N-type dopant atoms into the first N-type doped region; and
i) implanting P-type dopant atoms into the second N-type doped region.

12. The method of claim 11, wherein step c) implanting the N-type doped insulating well comprises deep implanting such that said N-type doped insulating well is positioned at a bottom surface of the P-type doped semiconductor substrate.

13. The method of claim 11, further comprising doping the second P-type doped semiconductor layer with carbon atoms.

14. The method of claim 11, further comprising, subsequent to step i), siliciding upper surfaces of the first, second, and third N-type doped regions and an upper surface of the second P-type doped semiconductor layer.

15. The method of claim 11, further comprising forming spacers on lateral edges of the second P-type doped semiconductor layer.

16. The method of claim 11, wherein steps a) through e) are performed in common with manufacturing of N-channel and P-channel MOS transistors supported by the P-type doped semiconductor substrate.

17. The method of claim 11, further comprising creating an opening in a portion of the third N-type doped region and wherein step g) epitaxially growing comprises selective epitaxially growing in said opening.

* * * * *